(12) United States Patent
Connell et al.

(10) Patent No.: US 9,705,545 B2
(45) Date of Patent: Jul. 11, 2017

(54) TUNABLE RADIO FREQUENCY LOW NOISE AMPLIFIER

(71) Applicant: Futurewei Technologies, Inc., Plano, TX (US)

(72) Inventors: Lawrence Connell, Naperville, IL (US); Terrie McCain, Round Lake, IL (US); William Roeckner, Carpentersville, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/131,894

(22) Filed: Apr. 18, 2016

(65) Prior Publication Data

US 2016/0233905 A1   Aug. 11, 2016

Related U.S. Application Data

(63) Continuation of application No. 13/955,514, filed on Jul. 31, 2013, now Pat. No. 9,319,009.

(51) Int. Cl.
*H04B 1/40* (2015.01)
*H04B 1/12* (2006.01)
(Continued)

(52) U.S. Cl.
CPC ............ *H04B 1/123* (2013.01); *H03F 1/223* (2013.01); *H03F 1/56* (2013.01); *H03F 3/193* (2013.01);
(Continued)

(58) Field of Classification Search
CPC .............. H03F 1/223; H03F 2200/294; H03F 2203/45396; H03F 1/56; H03F 2200/492
(Continued)

(56) References Cited

U.S. PATENT DOCUMENTS 7,283,793 B1   10/2007   Mckay et al.
8,761,707 B1    6/2014   Connell et al.
(Continued)

FOREIGN PATENT DOCUMENTS

CN    102684641 A    9/2012
JP    2008118321 A   5/2008
KR    20100027847 A  3/2010

OTHER PUBLICATIONS

Partial English Translation and Abstract of Korean Patent Application No. KR2010-0027847, Jan. 14, 2015, 8 pages.
(Continued)

*Primary Examiner* — Ayodeji Ayotunde
*Assistant Examiner* — Max Mathew
(74) *Attorney, Agent, or Firm* — Conley Rose, P.C.

(57) ABSTRACT

An apparatus comprising an amplifier comprising an input, a capacitor having a capacitor first side and a capacitor second side, wherein the capacitor first side is coupled to the input, a switch having a switch first side and a switch second side, wherein the switch first side is coupled to the capacitor second side, and a transistor having a transistor gate, and a transistor source, wherein the transistor gate is coupled to the input and the capacitor first side, wherein the transistor source is coupled to the switch second side and wherein the switch is positioned directly between the capacitor second side and the transistor source.

18 Claims, 7 Drawing Sheets

(51) Int. Cl.

| | |
|---|---|
| *H03F 3/193* | (2006.01) |
| *H03F 1/22* | (2006.01) |
| *H03F 1/56* | (2006.01) |
| *H03F 3/195* | (2006.01) |
| *H04B 1/44* | (2006.01) |
| *H04L 27/14* | (2006.01) |

(52) U.S. Cl.
CPC .............. *H03F 3/195* (2013.01); *H04B 1/44* (2013.01); *H04L 27/14* (2013.01); *H03F 2200/165* (2013.01); *H03F 2200/213* (2013.01); *H03F 2200/249* (2013.01); *H03F 2200/294* (2013.01); *H03F 2200/451* (2013.01); *H03F 2200/492* (2013.01)

(58) Field of Classification Search
USPC .......................................... 455/188.1, 168.1
See application file for complete search history.

(56) References Cited

U.S. PATENT DOCUMENTS

| | | | | |
|---|---|---|---|---|
| 8,781,415 | B1* | 7/2014 | Coumou | H03H 7/40 330/149 |
| 2002/0102971 | A1* | 8/2002 | Jayaraman | H03F 1/0205 455/127.2 |
| 2002/0190279 | A1* | 12/2002 | Nakatsuka | H01L 27/0207 257/204 |
| 2003/0102912 | A1* | 6/2003 | Tripathi | H03G 3/004 330/136 |
| 2003/0128522 | A1* | 7/2003 | Takeda | H01L 23/345 361/715 |
| 2005/0208921 | A1 | 9/2005 | Roufoogaran | |
| 2007/0052650 | A1 | 3/2007 | Tai et al. | |
| 2007/0066256 | A1* | 3/2007 | Lee | H04B 1/0057 455/188.1 |
| 2008/0079650 | A1* | 4/2008 | Constantinidis | H01Q 7/005 343/858 |
| 2008/0231362 | A1* | 9/2008 | Muthali | H03F 1/32 330/253 |
| 2009/0195316 | A1* | 8/2009 | Park | H03F 3/193 330/277 |
| 2009/0258624 | A1 | 10/2009 | Gudem et al. | |
| 2010/0026393 | A1* | 2/2010 | Keerti | H03F 1/56 330/302 |
| 2010/0041361 | A1* | 2/2010 | Ojo | H03F 1/223 455/334 |
| 2011/0086600 | A1* | 4/2011 | Muhammad | H04B 1/0458 455/120 |
| 2012/0249270 | A1* | 10/2012 | Li | H04B 1/18 334/78 |
| 2013/0076495 | A1 | 3/2013 | Magnusen et al. | |

OTHER PUBLICATIONS

Foreign Communication From a Counterpart Application, PCT Application No. PCT/CN2014/083469, International Search Report dated Oct. 27, 2014, 8 pages.

Foreign Communication From a Counterpart Application, PCT Application No. PCT/CN2014/083469, Written Opinion dated Oct. 27, 2014, 8 pages.

Office Action dated Jan. 13, 2015, 6 pages, U.S. Appl. No. 13/955,514, filed Jul. 31, 2013.

Office Action dated Jul. 29, 2015, 15 pages, U.S. Appl. No. 13/955,514, filed Jul. 31, 2013.

Notice of Allowance dated Dec. 9, 2015, 9 pages, U.S. Appl. No. 13/955,514, filed Jul. 31, 2013.

* cited by examiner

TUNABLE RADIO FREQUENCY LOW NOISE AMPLIFIER

CROSS-REFERENCE TO RELATED APPLICATIONS

This application is a continuation of U.S. application Ser. No. 13/955,514, entitled "Tunable Radio Frequency Low Noise Amplifier," which was filed on Jul. 31, 2013, and hereby incorporated in its entirety.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Radio frequency receiver circuits may be used in numerous types of wireless communications systems, including cellular, WiFi, and Bluetooth® applications and devices. One component of radio frequency receiver circuits may be a low noise amplifier (LNA), which often may be located in the front-end of the radio frequency receiver circuits. In modern applications for these circuits, such as cellular transceivers, it may be desirable that the receiver circuits be capable of operating over a wide range of frequencies, usually only accomplished by sacrificing size, signal quality, power consumption, and cost. As such, an ability to provide wide frequency range coverage while preserving signal quality and using minimal space may be desirable.

SUMMARY

In one embodiment, the disclosure includes an apparatus comprising an amplifier comprising an amplifier input, a capacitor having a capacitor first side and a capacitor second side, wherein the capacitor first side is coupled to the amplifier input, a switch having a switch first side and a switch second side, wherein the switch first side is coupled to the capacitor second side, and a transistor having a transistor gate, a transistor source, and a transistor drain, wherein the transistor gate is coupled to the amplifier input and the capacitor first side, wherein the transistor source is coupled to the switch second side and wherein the switch is positioned directly between the capacitor second side and the transistor source.

In another embodiment, the disclosure includes an apparatus comprising an antenna, a surface acoustic wave (SAW) filter or a duplexor coupled to the antenna, a matching network coupled to the SAW filter or the duplexor, an amplifier coupled to the matching network, wherein the amplifier comprises a switched capacitor, and wherein an operating frequency range of the amplifier is varied by switching the capacitors on and off, a mixer coupled to the amplifier, and a baseband filter coupled to the mixer.

In yet another embodiment, the disclosure includes a method comprising receiving a plurality of input frequency bands, and optimizing an S11 response for the input frequency bands using only one matching network and only one amplifier.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Modern cellular transceivers may be designed to operate with frequency receive bands from 700 megahertz (MHz) to 2700 MHz or larger. The bandwidths of these receive bands may range from as small as 10 MHz to as large as 200 MHz, with a typical bandwidth being in the range of 10 MHz to 75 MHz. A conventional low noise amplifier (LNA) with a reasonably high effective parallel resistance (Rp) may have a bandwidth of as much as 100 MHz to 250 MHz, but in order to cover the entire 700 MHz to 2700 MHz spectrum, a large number of ports may be required. To achieve the required coverage, presently available devices may utilize a large number of LNAs, each created for a specific narrow frequency range, or a multitude of surface acoustic wave (SAW) filters or duplexor components whose signals are then switched into an LNA. Either presently available solution requires large amounts of space and power to accomplish, and leads to higher costs.

Disclosed herein are embodiments of an LNA that may utilize a digitally programmable capacitive network so that the LNA is tunable to a plurality of narrow frequency ranges, allowing wide frequency range input overall while maintaining the benefits of a narrowband LNA. The disclosed embodiments of the LNA may be utilized in a plurality of applications, including communications devices. The disclosed embodiments of the LNA may allow a single LNA to operate over a plurality of frequency bands while using a single common matching network and input port and maintaining the positive aspects of conventional narrowband LNA devices, such as a high gain and low noise figure.

Figure 1:
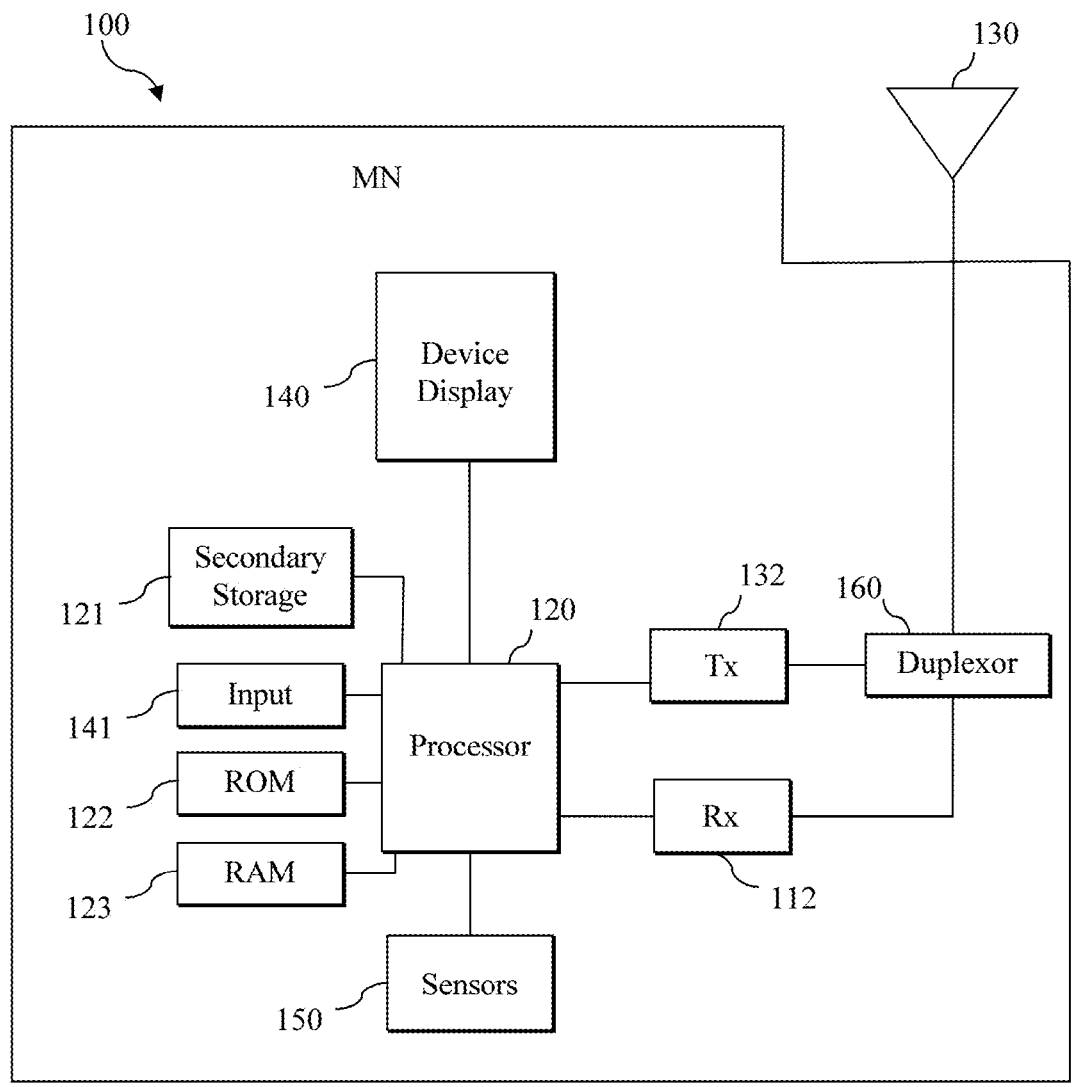
FIG. 1 is a schematic diagram of an embodiment of a mobile node in which a receiver circuit may be used.

FIG. 1 is a schematic diagram of an embodiment of a mobile node (MN) 100. MN 100 may comprise a two-way wireless communication device having voice and/or data communication capabilities. In some aspects, voice communication capabilities are optional. The MN 100 generally has the capability to communicate with other computer systems on the Internet and/or other networks. Depending on the exact functionality provided, the MN 100 may be referred to as a data messaging device, a tablet computer, a two-way pager, a wireless e-mail device, a cellular telephone with data messaging capabilities, a wireless Internet appliance, a wireless device, a smart phone, a mobile device, or a data communication device, as examples.

MN 100 may comprise a processor 120 (which may be referred to as a central processor unit or CPU) that may be in communication with memory devices including secondary storage 121, read only memory (ROM) 122, and random access memory (RAM) 123. The processor 120 may be implemented as one or more general-purpose CPU chips, one or more cores (e.g., a multi-core processor), or may be part of one or more application specific integrated circuits (ASICs) and/or digital signal processors (DSPs). The processor 120 may be implemented using hardware, software, firmware, or combinations thereof.

The secondary storage 121 may be comprised of one or more solid-state drives and/or disk drives that may be used for non-volatile storage of data and as an over-flow data storage device if RAM 123 is not large enough to hold all working data. Secondary storage 121 may be used to store programs that are loaded into RAM 123 when such programs are selected for execution. The ROM 122 may be used to store instructions and perhaps data that are read during program execution. ROM 122 may be a non-volatile memory device and may have a small memory capacity relative to the larger memory capacity of secondary storage 121. The RAM 123 may be used to store volatile data and perhaps to store instructions. Access to both ROM 122 and RAM 123 may be faster than to secondary storage 121.

MN 100 may be any device that communicates data (e.g., packets) wirelessly with a network. The MN 100 may comprise a receiver (Rx) 112, which may be configured for receiving data, packets, or frames from other components. The receiver 112 may be coupled to the processor 120, which may be configured to process the data and determine to which components the data is to be sent. The MN 100 may also comprise a transmitter (Tx) 132 coupled to the processor 120 and configured for transmitting data, packets, or frames to other components. The MN 100 may further comprise a duplexor 160 for allowing a transmitter and a receiver to use a same antenna. The receiver 112 and transmitter 132 may be coupled to the duplexor 160, which may be coupled to an antenna 130, which may be configured to receive and transmit wireless (radio) signals.

The MN 100 may also comprise a device display 140 coupled to the processor 120 and that is configured to display output to a user. The device display 140 may comprise a light-emitting diode (LED) display, a Color Super Twisted Nematic (CSTN) display, a thin film transistor (TFT) display, a thin film diode (TFD) display, an organic LED (OLED) display, an active-matrix OLED display, or any other display screen. The device display 140 may display in color or monochrome and may be equipped with a touch sensor based on resistive and/or capacitive technologies.

The MN 100 may further comprise input device 141 coupled to the processor 120, which may allow a user to input commands to the MN 100. In the case that the display device 140 comprises a touch sensor, the display device 140 may also be considered an input device 141. In addition to and/or in the alternative, an input device 141 may comprise a mouse, trackball, built-in keyboard, external keyboard, and/or any other device that a user may employ to interact with the MN 100. The MN 100 may further comprise sensors 150 coupled to the processor 120. Sensors 150 may detect and/or measure conditions in and/or around MN 100 at a specified time and transmit related sensor input and/or data to processor 120.

It is understood that by programming and/or loading executable instructions onto the MN 100, at least one of the receiver 112, processor 120, secondary storage 121, ROM 122, RAM 123, antenna 130, transmitter 132, input device 141, display device 140, sensors 150, and/or duplexor 160 are changed, transforming the MN 100 in part into a particular machine or apparatus, e.g., a digitally tunable amplifier, having the novel functionality taught by the present disclosure. It is fundamental to the electrical engineering and software engineering arts that functionality that can be implemented by loading executable software into a computer can be converted to a hardware implementation by well-known design rules. Decisions between implementing a concept in software versus hardware typically hinge on considerations of stability of the design and numbers of units to be produced rather than any issues involved in translating from the software domain to the hardware domain. Generally, a design that is still subject to frequent change may be preferred to be implemented in software, because re-spinning a hardware implementation is more expensive than re-spinning a software design. Generally, a design that is stable that will be produced in large volume may be preferred to be implemented in hardware, for example in an ASIC, because for large production runs the hardware implementation may be less expensive than the software implementation. Often a design may be developed and tested in a software form and later transformed, by well-known design rules, to an equivalent hardware implementation in an ASIC that hardwires the instructions of the software. In the same manner as a machine controlled by a new ASIC is a particular machine or apparatus, likewise a computer that has been programmed and/or loaded with executable instructions may be viewed as a particular machine or apparatus.

Figure 2:
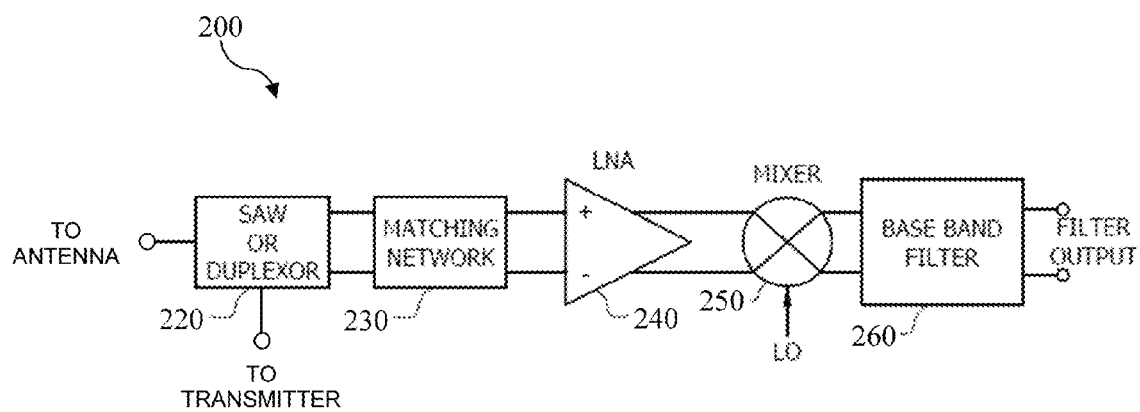
FIG. 2 is a schematic diagram of an embodiment of a receiver circuit.

FIG. 2 is a schematic diagram of an embodiment of a receiver assembly 200, which may be similar to duplexor 160 and/or receiver 112. Receiver assembly 200 may be used as part of a wireless communication device, such as a cellular phone, smart phone, or tablet computer. Receiver assembly 200 may comprise a SAW filter or duplexor 220, a matching network 230, an LNA 240, a radio frequency (RF) mixer 250, and a base band filter 260 configured as shown in FIG. 2. The SAW filter or duplexor 220 may be configured to receive an RF signal from an antenna. The SAW filter or duplexor 220 and matching network 230 may perform filtering and impedance matching, respectively. In some embodiments, receiver assembly 200 may comprise only one matching network 230 and only one LNA 240. The LNA 240 may comprise a typical LNA structure coupled with a network of digitally controllable capacitors for tuning the operational frequency range of the LNA. The mixer 250 may convert a relatively high-frequency RF input signal to a lower or intermediate frequency (IF) signal or base band signal for subsequent processing. The mixer 250 may be coupled to a differential local oscillator (LO) at a given frequency to help perform the described frequency conversion. In receiver assembly 200, the mixer 250 may be followed by a base band filter 260 that provides a signal for baseband processing. As a person of ordinary skill in the art will recognize, receiver assembly 200 is but one possible configuration or embodiment in which an LNA, such as LNA 240, may be used.

Figure 3:
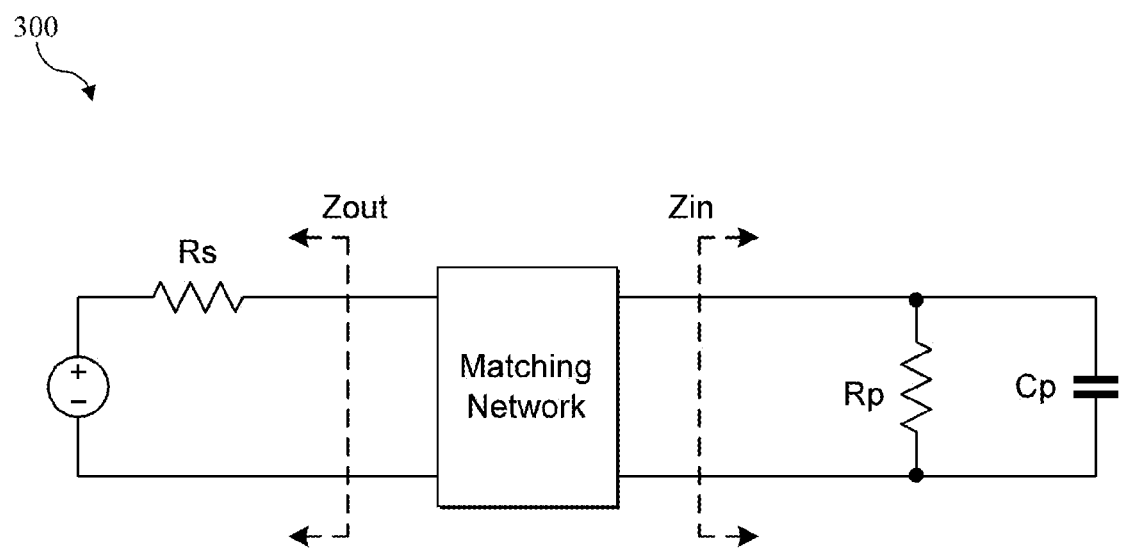
FIG. 3 is an impedance model of an embodiment of a receiver circuit for passive gain determination.

FIG. 3 is an impedance model 300 of a receiver circuit used for passive gain determination. In designing LNAs, it may be desirable to minimize an impedance mismatch between an input impedance of the LNA, Zin, and an output impedance of a source, Zout, as shown in FIG. 3. It may be desirable to design the match such that the circuit has a higher Q factor associated with the matching network, resulting in a narrower bandwidth in which the LNA may operate. In impedance model 300, Rs may represent a source impedance of a signal driving the matching network. The input impedance of an LNA, such as LNA 240, may be represented by an effective parallel resistance Rp in parallel with an effective parallel capacitance, Cp. It may be advantageous to design the LNA such that Rp is larger than Rs, thus achieving a higher passive gain $G_{passive}$ as is described by the equation $$G_{passive} = \sqrt{\frac{Rp}{Rs}}.$$

A higher passive gain may enable the LNA design to have a lower noise figure and reduced power dissipation; however, a higher passive gain and lower noise factor increases the Q factor of the amplifier, narrows the bandwidth in which the LNA may operate. The Q factor of an amplifier, such as LNA 240, may be determined according to the equation $$Q = \sqrt{\frac{Rp}{Rs} - 1}.$$

The input impedance of a conventional LNA, may be approximated by $$Z_{IN} = j\left(\omega L - \frac{1}{\omega C_{gs}}\right) + \frac{g_m L}{C_{gs}}$$

while the input impedance for the equivalent impedance model 300 may be approximated by $$Rp = \frac{1}{C_{gs}}\left(\frac{1}{\omega^2 g_m L} + g_m L\right),$$

where $g_m$ is the transconductance of the input transistor of the amplifier, $C_{gs}$ is the total amount of capacitance between the gate terminal and source terminal of the input transistor of the amplifier, and L is the value of any degenerating inductor coupled to the amplifier. In a conventional LNA circuit, Rp may be set by a value of the inductor L and may be unchangeable. In an embodiment disclosed herein, Rp may be controlled by $C_{gs}$ and may be variable, dependent on the amount of capacitance coupled into the LNA at any given time. In one embodiment, a narrowband LNA may have a passive gain of at least about 12 decibels (dB), and a noise figure of less than about 2.3 dB for low frequency bands, less than about 2.5 dB for high frequency bands, and less than about 2.8 dB for ultra-high frequency bands. As one of ordinary skill in the art will appreciate, these values are only exemplary and may be a matter of design choice as a result of the trade-offs involved in achieving the values.

Figure 4:
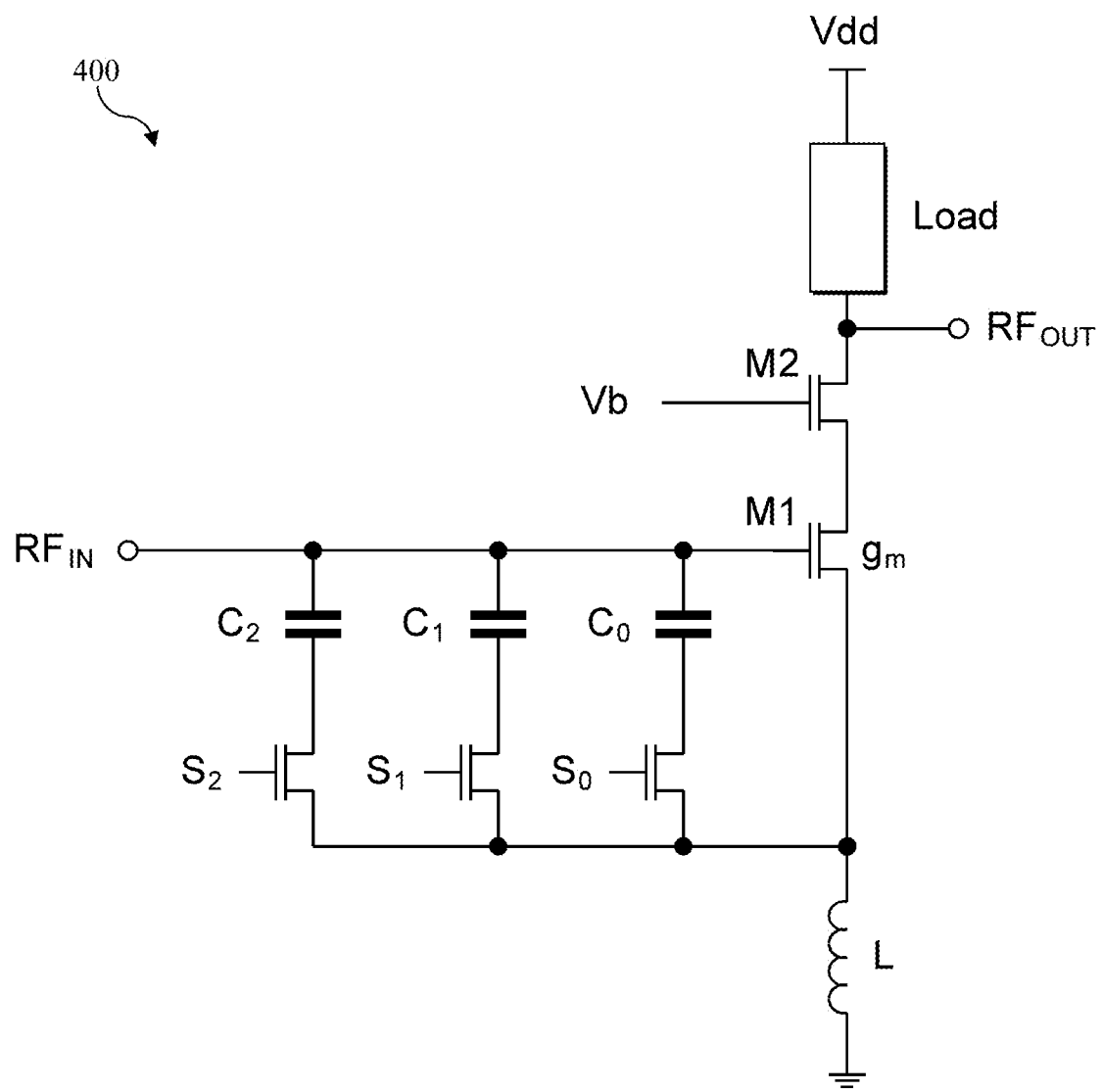
FIG. 4 is a schematic diagram of an embodiment of a tunable amplifier circuit.

FIG. 4 is a schematic diagram of an embodiment of a tunable amplifier circuit 400. The amplifier circuit 400 may be used as an LNA, such as LNA 240 in receiver assembly 200. In one embodiment, amplifier circuit 400 may comprise one or more capacitors $C_0$-$C_2$ coupled via one or more switches $S_0$-$S_2$ to a conventional low noise amplifier structure. Capacitors $C_0$-$C_2$ are each represented as a single capacitor for exemplary purposes, but in practice may comprise one or more capacitors coupled to form a desired amount of total capacitance. The low noise amplifier structure may comprise n-type metal oxide semiconductor (NMOS) transistors M1-M2, inductor L, and a load structure, wherein M1 and M2 may be viewed as a two-transistor cascade stage degenerated with a source inductor, and M2 is a common gate transistor with a bias voltage applied to its gate. The amplifier circuit 400 may be configured to receive an RF input and generate an RF output. A frequency range in which the amplifier circuit 400 may be capable of operating may be determined according to the amount of capacitance coupled between the gate terminal and source terminal of M1. As one of ordinary art in the skill will appreciate, the couplings of the amplifier circuit 400 may be reconfigured to employ p-type metal oxide semiconductor (PMOS) transistors for transistors M1-M2. As one of ordinary skill in the art will also see, a conventional low noise amplifier is only one example of an amplifier for which its frequency range may be controlled by coupling or uncoupling capacitance from the amplifier.

The amplifier circuit 400 may be tunable to a plurality of input electrical signal frequency bands. In one embodiment, switches $S_0$-$S_2$ may comprise NMOS transistors that may be toggled open or closed by varying a voltage potential on their respective gate terminals. The switches $S_0$-$S_2$ may be controlled by a controller, e.g., a digital device, coupled to their gate terminals, wherein switches $S_0$-$S_2$ may be toggled closed by the controller asserting a "1" on their respective gate terminals, and toggled open by the controller asserting a "0" on their respective gate terminals. The particular voltage represented by "1" and "0" may be a matter of design choice, and may be, for example, logic-level voltages, supply voltage and ground, or other suitable voltage levels available in the circuit. Transistors $S_0$-$S_2$ may be toggled in $2^n$ various combinations, where n may be the number of switches $S_0$-$S_2$ and the number of corresponding control bits that may be required by the amplifier circuit 400. As one of ordinary art in the skill will appreciate, the couplings of the amplifier circuit 400 may be reconfigured to employ PMOS transistors for switches $S_0$-$S_2$.

When a switch $S_0$-$S_2$ is toggled closed, the corresponding capacitor $C_0$-$C_2$ may be coupled into the amplifier circuit 400, lowering the range of frequencies in which the amplifier circuit 400 may operate. When a switch $S_0$-$S_2$ is toggled open, the corresponding capacitor $C_0$-$C_2$ may be uncoupled from the amplifier circuit 400, increasing the range of frequencies in which the amplifier circuit 400 may operate.

For a target passive gain, the frequency range in which the amplifier circuit 400 may operate may be determined by adding the parasitic capacitance (not shown) of M1 with any additional capacitance that has been added between the gate terminal and source terminal of M1, and solving the equation:

$$Rp = \frac{1}{C_{gs}}\left(\frac{1}{\omega^2 g_m L} + g_m L\right)$$

for the variable ω. Altering the amount of capacitance coupled between the gate terminal and source terminal of M1 may shift the reflection coefficient of the circuit so that it may be optimized for a certain center frequency and frequency band. By increasing the amount of capacitance coupled between the gate terminal and source terminal of M1, the frequency range in which the amplifier circuit 400 may operate may be decreased. By decreasing the amount of capacitance coupled between the gate terminal and source terminal of M1, the frequency range in which the amplifier circuit 400 may operate may be increased. Adding or removing capacitance may be accomplished by toggling switches $S_0$-$S_2$ to couple the corresponding capacitors $C_0$-$C_2$ into or out of amplifier circuit 400. Altering the operational frequency range of amplifier circuit 400 may allow the amplifier circuit 400 to cover a broader range of input electrical signal frequency bands using a single amplifier, a single, common matching network, and a single, common input port. Altering the frequency range in which the amplifier circuit 400 may operate may allow the amplifier circuit 400 to retain the high gain and low noise characteristics of a conventional LNA for a wide frequency range that are conventionally only achievable for wide ranges at the expense of size, cost, and quality. While only three capacitors $C_0$-$C_2$ and three corresponding switches $S_0$-$S_2$ have been shown for exemplary purposes, in practice any number of capacitors $C_0$-$C_N$ may be coupled with any number of corresponding switches $S_0$-$S_N$, where N is an integer, to achieve a desired result.

Figure 5:
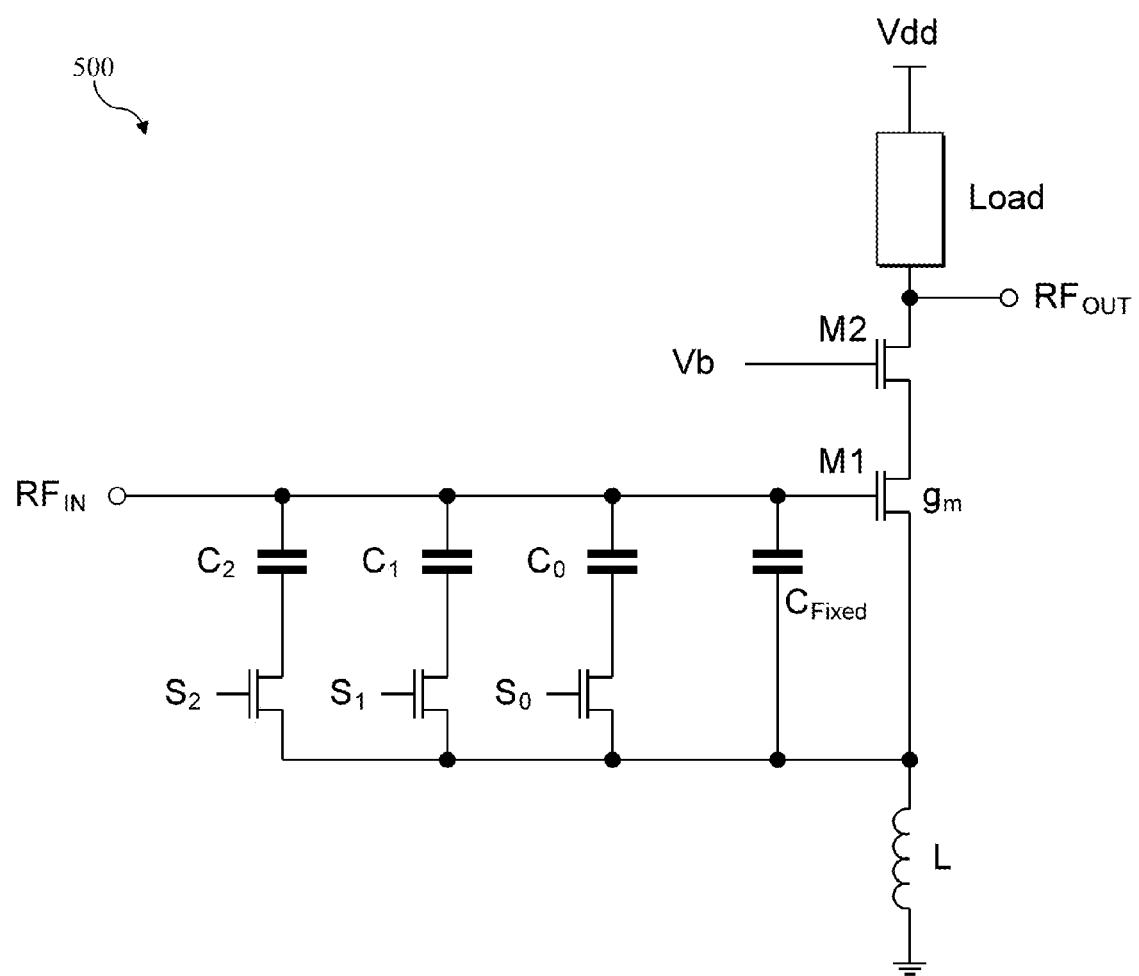
FIG. 5 is a schematic diagram of another embodiment of a tunable amplifier circuit.

FIG. 5 is a schematic diagram of another embodiment of a tunable amplifier circuit 500. Amplifier circuit 500 may be substantially similar to amplifier circuit 400, with the exception that amplifier circuit 500 may comprise an additional non-switched capacitor $C_{FIXED}$ coupled directly between the gate terminal and source terminal of transistor M1. The use of capacitor $C_{FIXED}$ is optional, but if used, may lower the frequency range in which amplifier circuit 500 may operate.

Figure 6:
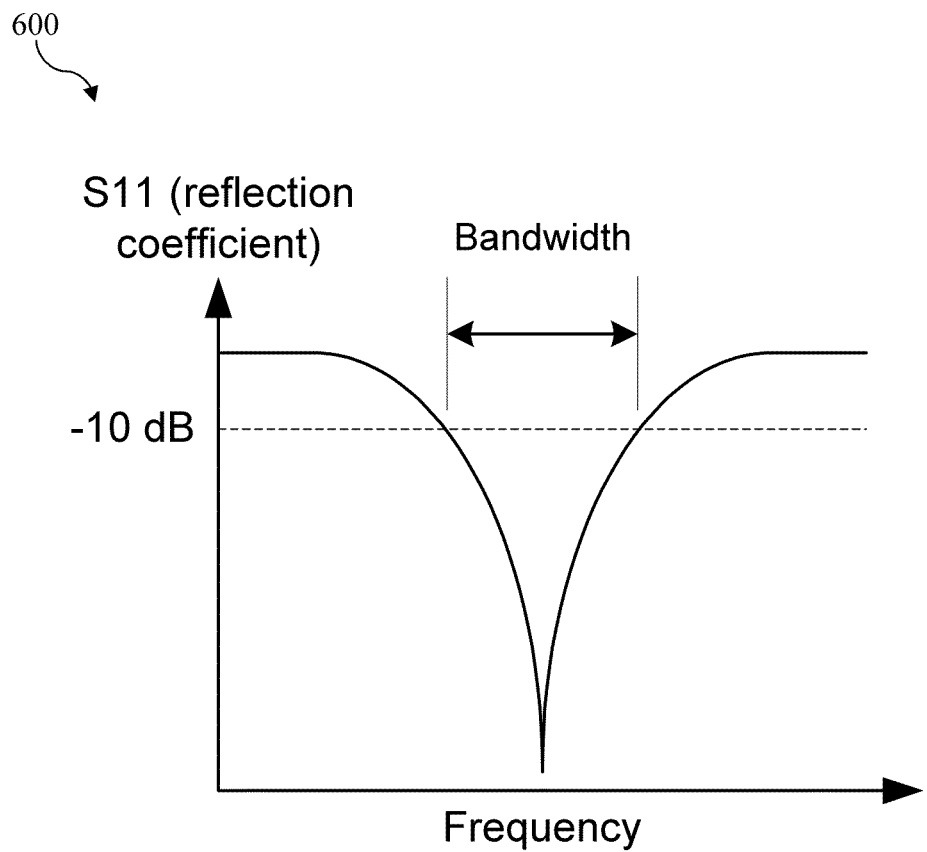
FIG. 6 is a graph of a reflection coefficient showing the usable bandwidth of a circuit.

FIG. 6 is a graph 600 of a reflection coefficient showing the usable bandwidth of a circuit. The frequency range for which an amplifier circuit, such as amplifier circuit 400, is usable may be determined by examining the input port voltage reflection coefficient (S11) measurements of the amplifier. The usable bandwidth of an amplifier circuit is generally considered by one of ordinary skill in the art to be the frequency range for which an S11 value is less than or equal to −10 decibels (dB). When using a conventional LNA, each input electrical signal frequency band may require its own unique matching network that may be specific to that frequency band and have an S11 value that is centered on the desired frequency band. The disclosed embodiment of amplifier circuit 400 facilitates adjusting the S11 response, as previously discussed, so that a single matching network and input port may be employed for a plurality of input electrical signal frequency bands.

Figure 7:
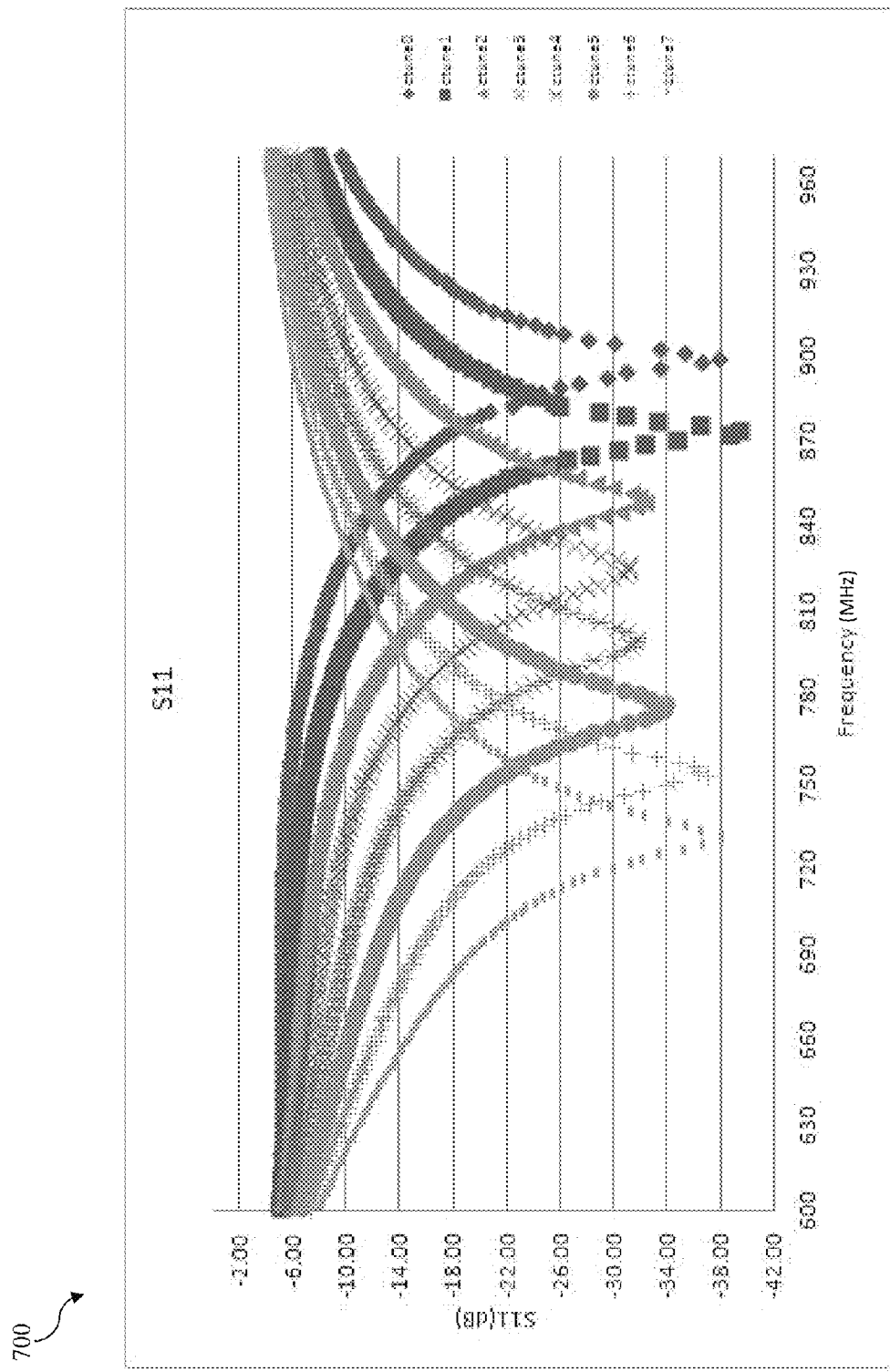
FIG. 7 is a graph of reflection coefficients of an embodiment of a tunable amplifier circuit.

FIG. 7 is a graph of reflection coefficients 700 of an embodiment of an amplifier circuit that is capable of being tuned to a multitude of center frequencies. In one low frequency band embodiment of amplifier circuit 400, M1-M2 may have widths of 312.5 micrometers (microns) and 189 microns respectively, and lengths of 0.1 microns, L may be 1173 picohenries (pH), $S_0$-$S_2$ may have widths of 20 microns, 40 microns, and 80 microns respectively with lengths of 0.1 microns, and $C_0$-$C_2$ may be combinations of one or more capacitors totaling 100 femtoFarad (fF), 200 fF, and 400 fF respectively. As shown in the graph of reflection coefficients 700, using this low frequency band embodiment, an amplifier with an input frequency range from about 620 MHz to about 960 MHz, or about 340 MHz, may be created. As shown below in Table 1, the amount of capacitance coupled into the amplifier circuit 400 may determine the input electrical signal frequency band on which the amplifier is centered.

TABLE 1

| Control Bit Settings | | | Capacitors Coupled Into Amplifier | Corresponding Label on Graph 700 |
|---|---|---|---|---|
| 0 | 0 | 0 | None | ctune_0 |
| 0 | 0 | 1 | $C_0$ | ctune_1 |
| 0 | 1 | 0 | $C_1$ | ctune_2 |
| 0 | 1 | 1 | $C_1$ & $C_0$ | ctune_3 |
| 1 | 0 | 0 | $C_2$ | ctune_4 |
| 1 | 0 | 1 | $C_2$ & $C_0$ | ctune_5 |
| 1 | 1 | 0 | $C_2$ & $C_1$ | ctune_6 |
| 1 | 1 | 1 | $C_2$ & $C_1$ & $C_0$ | ctune_7 |

Increasing the value of individual capacitors $C_0$-$C_2$ may reduce the amount of overlap in frequency band coverage that may be seen in graph 700, and may enable the amplifier to operate over an even broader range of frequencies.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 5 percent, . . . , 50 percent, 51 percent, 52 percent, . . . , 95 percent, 96 percent, 97 percent, 98 percent, 99 percent, or 100 percent. Moreover, any numerical range defined by two R numbers as defined in the above is also specifically disclosed. The use of the term about means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. An apparatus comprising:
   an antenna;
   a surface acoustic wave (SAW) filter or a duplexor coupled to the antenna;
   a matching network coupled to the SAW filter or the duplexor;
   an amplifier coupled to the matching network, wherein the amplifier comprises:
      a transistor having a transistor gate, a transistor source, and a transistor drain;
      a controllable capacitor comprising at least one capacitor coupled to a switch, wherein an operating frequency range of the amplifier is varied by switching the controllable capacitor on and off, wherein the transistor gate is coupled to an amplifier input and a first side of the controllable capacitor, and wherein the transistor source is coupled to a second side of the controllable capacitor; and
      an inductor having an inductor first end and an inductor second end, wherein the inductor first end is coupled the second side of the controllable capacitor and the transistor source, and wherein the inductor second end is coupled to a ground;
   a mixer coupled to the amplifier; and
   a baseband filter coupled to the mixer.

2. The apparatus of claim 1, wherein the apparatus comprises only one matching network positioned between the SAW filter or the duplexor and the amplifier.

3. The apparatus of claim 2, wherein the apparatus comprises only one amplifier positioned between the matching network and the mixer.

4. The apparatus of claim 3, wherein the apparatus has only one input port.

5. The apparatus of claim 4, wherein the amplifier is configured to amplify a plurality of electrical signals for a plurality of frequency input bands.

6. The apparatus of claim 1, wherein the amplifier further comprises:

a second transistor having a second transistor gate, a second transistor source, and a second transistor drain, wherein the second transistor source is coupled to the transistor drain, and wherein the second transistor drain is coupled to the mixer; and
a controller coupled to the controllable capacitor, wherein the controller controls the switching of the controllable capacitor.

7. The apparatus of claim 1, wherein the operating frequency range of the amplifier is varied based on a reflection coefficient of the amplifier for a particular frequency input band, and wherein the mixer is configured to convert a high frequency (HF) radio frequency (RF) input signal to a lower or intermediate frequency (IF) signal or base band signal.

8. The apparatus of claim 1, wherein the controllable capacitor comprises a network of digitally controllable capacitors for tuning the operational frequency range of the amplifier, and wherein network of digitally controllable capacitors comprises:
   a capacitor having a capacitor first side and a capacitor second side, wherein the capacitor first side is coupled to the amplifier input; and
   a switch having a switch first side and a switch second side, wherein the switch first side is coupled to the capacitor second side, and wherein the switch second side is coupled to the transistor source.

9. The apparatus of claim 8, wherein the amplifier further comprises a second capacitor having a second capacitor first side and a second capacitor second side, wherein the second capacitor first side is coupled to the amplifier input, and a second switch having a second switch first side and a second switch second side, wherein the second switch first side is coupled to the second capacitor second side, and wherein the second switch second side is coupled to the switch second side, the inductor first end, and the transistor source.

10. The apparatus of claim 9, wherein the amplifier further comprises a third capacitor having a third capacitor first side and a third capacitor second side, wherein the third capacitor first side is coupled to the amplifier input, and wherein the third capacitor second side is directly connected to the switch second side, the second switch second side, the inductor first end, and the transistor source without any intervening components.

11. The apparatus of claim 10, wherein the amplifier further comprises a controller coupled to the switch and the second switch, and wherein the controller is configured to vary an operating frequency range of the amplifier by opening and closing the switch and the second switch.

12. The apparatus of claim 9, wherein the amplifier further comprises an amplifier output and a second transistor, wherein the second transistor has a second transistor gate, a second transistor source, and a second transistor drain, wherein the second transistor gate is coupled to a bias voltage potential, wherein the second transistor source is coupled to the transistor drain, and wherein the second transistor drain is coupled to the amplifier output.

13. The apparatus of claim 12, wherein the amplifier further comprises a load having a load first end coupled to a voltage potential and a load second end coupled to the second transistor drain and the amplifier output.

14. The apparatus of claim 13, wherein the apparatus has only one amplifier for a plurality of input electrical signal frequency bands, and wherein the apparatus has only one amplifier positioned between the matching network and the mixer.

15. An amplifier tuning method comprising:
receiving, at an amplifier input of an amplifier, an input signal;
varying, by a controller of the amplifier coupled to a network of digitally controllable capacitors, an operating frequency range of the amplifier by opening and closing one or more digitally controllable capacitors of the network of digitally controllable capacitors; and
providing, at an amplifier output of the amplifier, an amplified output signal,
wherein each controllable capacitor of the network of digitally controllable capacitors comprises a capacitor coupled to a switch, wherein a first end of the controllable capacitor is coupled to the amplifier input.

16. The amplifier tuning method of claim 15, wherein the controller opens and closes the one or more of the digitally controllable capacitors by individually varying a voltage potential on a gate terminal of the switch.

17. The amplifier tuning method of claim 15, further comprising decreasing the operating frequency range of the amplifier when a controllable capacitor of the network of digitally controllable capacitors closed to form a closed capacitor, wherein the closed capacitor is coupled into the amplifier.

18. The amplifier tuning method of claim 15, further comprising increasing the operating frequency range of the amplifier when a controllable capacitor of the network of digitally controllable capacitors is opened to form an opened capacitor, wherein the opened capacitor is uncoupled from the amplifier.

* * * * *

UNITED STATES PATENT AND TRADEMARK OFFICE
CERTIFICATE OF CORRECTION

| | | |
|---|---|---|
| PATENT NO. | : 9,705,545 B2 | |
| APPLICATION NO. | : 15/131894 | |
| DATED | : July 11, 2017 | |
| INVENTOR(S) | : Lawrence Connell et al. | |

It is certified that error appears in the above-identified patent and that said Letters Patent is hereby corrected as shown below:

In the Claims

Column 11, Lines 19-24, Claim 17, should read:
17. The amplifier tuning method of claim 15, further comprising decreasing the operating frequency range of the amplifier when a controllable capacitor of the network of digitally controllable capacitors is closed to form a closed capacitor, wherein the closed capacitor is coupled into the amplifier.

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*